United States Patent
Kim et al.

(10) Patent No.: US 11,075,364 B2
(45) Date of Patent: Jul. 27, 2021

(54) DISPLAY DEVICE

(71) Applicant: LG Display Co., Ltd., Seoul (KR)

(72) Inventors: Dong-Yul Kim, Paju-si (KR); Nack-Bong Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/696,337

(22) Filed: Nov. 26, 2019

(65) Prior Publication Data
US 2020/0168844 A1  May 28, 2020

(30) Foreign Application Priority Data
Nov. 28, 2018 (KR) .................. 10-2018-0149490

(51) Int. Cl.
*H01L 51/52* (2006.01)
(52) U.S. Cl.
CPC ...... *H01L 51/5284* (2013.01); *H01L 51/5253* (2013.01); *H01L 51/5271* (2013.01)

(58) Field of Classification Search
CPC ............. H01L 51/5262; H01L 51/5284; H01L 27/3216; H01L 51/5271; G02F 1/133512; G02B 5/223
See application file for complete search history.

(56) References Cited

U.S. PATENT DOCUMENTS

| | | | |
|---|---|---|---|
| 2015/0076473 A1* | 3/2015 | Miyake | H01L 27/3216 257/40 |
| 2016/0284250 A1* | 9/2016 | Fujita | G09F 13/10 |
| 2017/0170254 A1* | 6/2017 | Ishii | H01L 27/322 |

* cited by examiner

*Primary Examiner* — Changhyun Yi
(74) *Attorney, Agent, or Firm* — Polsinelli PC (57) ABSTRACT

A display device comprises a display panel; a light control layer disposed on one side of the display panel through which light is transmitted, the light control layer including a plurality of light absorption patterns spaced apart from each other; and a plurality of reflection patterns disposed under the plurality of light absorption patterns and reflecting light travelling toward to the plurality of light absorption patterns.

21 Claims, 5 Drawing Sheets

DISPLAY DEVICE

CROSS REFERENCE TO RELATED APPLICATION

The present application claims priority from and the benefit under 35 U.S.C § 119(a) of Korean Patent Application No. 10-2018-0149490 on Nov. 28, 2018, which is hereby incorporated by reference in its entirety.

BACKGROUND

Field of the Disclosure

The present disclosure relates to a display device with a limited viewing angle.

Description of the Background

Recently, with entering into the full-fledged information age, there is a growing interest in information display dealing with and displaying mass information. In response to this, various flat panel display devices have been developed and have been in the spotlight.

Specific examples of the flat panel display devices include liquid crystal display (LCD) devices, plasma display panel (PDP) devices, field emission display (FED) devices, electroluminescence display (ELD) devices, organic light-emitting diode display (OLED) devices. The flat panel display devices show excellent performance of thin thickness, light weight, and low power consumption and have rapidly replaced cathode ray tube (CRT).

These display devices do not have the limitation of a viewing angle. However, recently, the limitation of the viewing angle has been required for reasons of privacy protection and information protection.

For example, devices such as ATMs of financial institutions, car navigation systems, notebook PCs, and tablet PCs require the limitation of the viewing angle in left and right or up and down directions to protect privacy.

Therefore, in recent years, a structure for applying a light control film has been proposed to limit the viewing angle. However, the manufacturing cost of a display device increases because the film is expensive, and the thickness of the display device also increases because of addition of the film. It is difficult to implement a lightweight and thin display device that has been recently required.

SUMMARY

Accordingly, aspects of the present disclosure are directed to a display device that substantially obviates one or more of the problems due to limitations and disadvantages of the related art.

An aspect of the present disclosure is to provide a display device that has the limited viewing angle.

Another aspect of the present disclosure is to provide a display panel that reduces the costs and simplifies the structure.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device includes a display panel; and a light control layer on one side of the display panel through which light is transmitted, the light control layer including a plurality of light absorption patterns spaced apart from each other, wherein reflection patterns are disposed under the light absorption patterns and reflect light travelling toward to the light absorption patterns.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of the disclosure, illustrate aspects of the disclosure and together with the description serve to explain various principles of the present disclosure.

In the drawings.

DETAILED DESCRIPTION

Reference will now be made in detail to aspects of the disclosure, examples of which are illustrated in the accompanying drawings.

Figure 1:
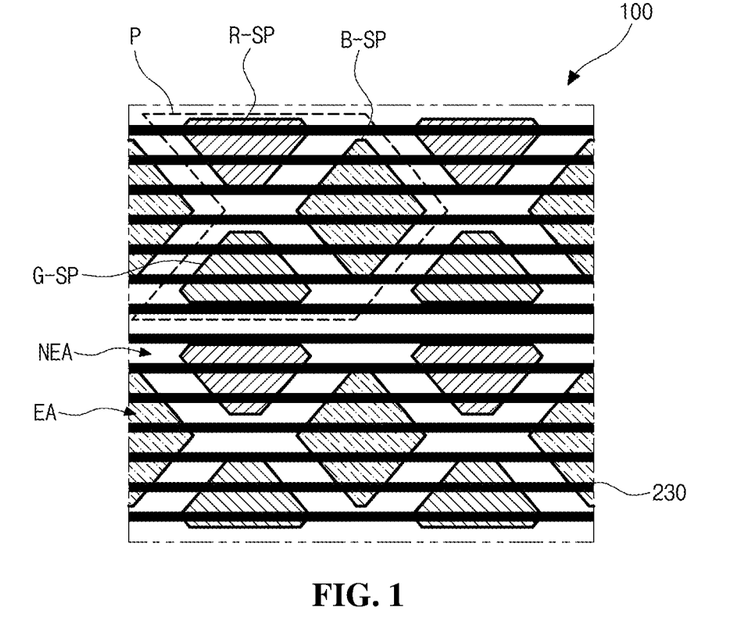
FIG. 1 is a plan view schematically illustrating an arrangement of some pixels and sub-pixels of a display device according to an aspect of the present disclosure.

FIG. 1 is a plan view schematically illustrating an arrangement of some pixels and sub-pixels of a display device according to an aspect of the present disclosure.

In FIG. 1, the display device 100 according to the aspect of the present disclosure includes a plurality of pixels P, and one unit pixel P includes three sub-pixels R-SP, G-SP and B-SP to implement full colors.

The three sub-pixels R-SP, G-SP and B-SP include a red sub-pixel R-SP, a green sub-pixel G-SP and a blue sub-pixel B-SP.

Here, since the blue sub-pixel B-SP has lower luminous efficiency than the red sub-pixel R-SP and the green sub-pixel G-SP, the blue sub-pixel B-SP may have a larger area than the red sub-pixel R-SP and the green sub-pixel G-SP. However, the sub-pixels R-SP, G-SP and B-SP of the display device 100 are not limited thereto.

That is, the display device 100 may include the red, green and blue sub-pixels R-SP, G-SP and B-SP having the same area or may further include a white sub-pixel W-SP in addition to the red sub-pixel R-SP, the green sub-pixel G-SP and the blue sub-pixel B-SP.

In addition, the display device 100 may include two green sub-pixels G-SP, which have the highest luminance weight among the three primary colors of R, G and B.

Further, each of the sub-pixels R-SP, G-SP and B-SP is illustrated as a polygon, but is not limited thereto. Each of the sub-pixels R-SP, G-SP and B-SP may have various shapes of circular, oval, semi-elliptic and the like.

Each of the sub-pixels R-SP, G-SP and B-SP includes an emission area EA, and a bank 117 (see FIG. 2) is disposed along an edge of the emission area EA, thereby forming a non-emission area NEA.

Here, the display device 100 according to the aspect of the present disclosure is characterized in that at least one light absorption pattern 230 is provided across each of the sub-pixels R-SP, G-SP and B-SP in one direction.

Through this, the display device 100 according to the aspect of the present disclosure has the limited viewing angle by blocking light incident thereon at an angle more than a specific angle.

That is, the display device 100 serves to display information desired by a user as an image and generally has a wide viewing angle so that the user can view the image at various angles. However, in each individual product to which the display device 100 is applied, there may be a case where the wide viewing angle has an adverse effect on the product characteristics, or there may be a case where the user requires the narrow viewing angle.

As an example, in the case of an ATM of a bank, the viewing angle of the display device 100 may need to be narrow because it is required to prevent other people around the user from viewing the personal information when the user enters the personal information.

As another example, in the case of navigation of a vehicle, when the viewing angle of the display device 100 is wide, the image display on the display device 100 may reduce the driver's concentration and interfere with driving. Further, when driving at night, the image display on the display device 100 may be reflected at the windshield of the vehicle and may adversely affect the driver's safe driving.

As another example, in the case of a computer or a portable electronic device, when the user does not want to expose the personal privacy, the wide viewing angle of the display device 100 may be contrary to the needs of the user.

As such, the display device 100 is generally manufactured to have the wide viewing angle, but it is required to have the narrow viewing angle according to the applied product.

Therefore, it is necessary to manufacture the display device 100 by adjusting the viewing angle so as to match the product to which the display device 100 is applied, but if the display device 100 is separately manufactured according to the product, the productivity is reduced.

Accordingly, a method of narrowing the viewing angle of the display device 100 manufactured to have a wide viewing angle is required. The display device 100 according to the aspect of the present disclosure may have a narrow viewing angle by further forming a light control layer 200 (shown FIG. 2) with a light absorption pattern 230 in a display device having a wide viewing angle.

Through this, the display device 100 according to the aspect of the present disclosure can protect the privacy, and it is not needed to add a separate film for limiting the viewing angle, thereby realizing the light weight and thin thickness of the display device 100.

Particularly, the viewing angle can be limited at low cost, and the structure can be simplified, thereby improving the efficiency of the process.

This will be described in more detail with reference to FIG. 2.

Figure 2:
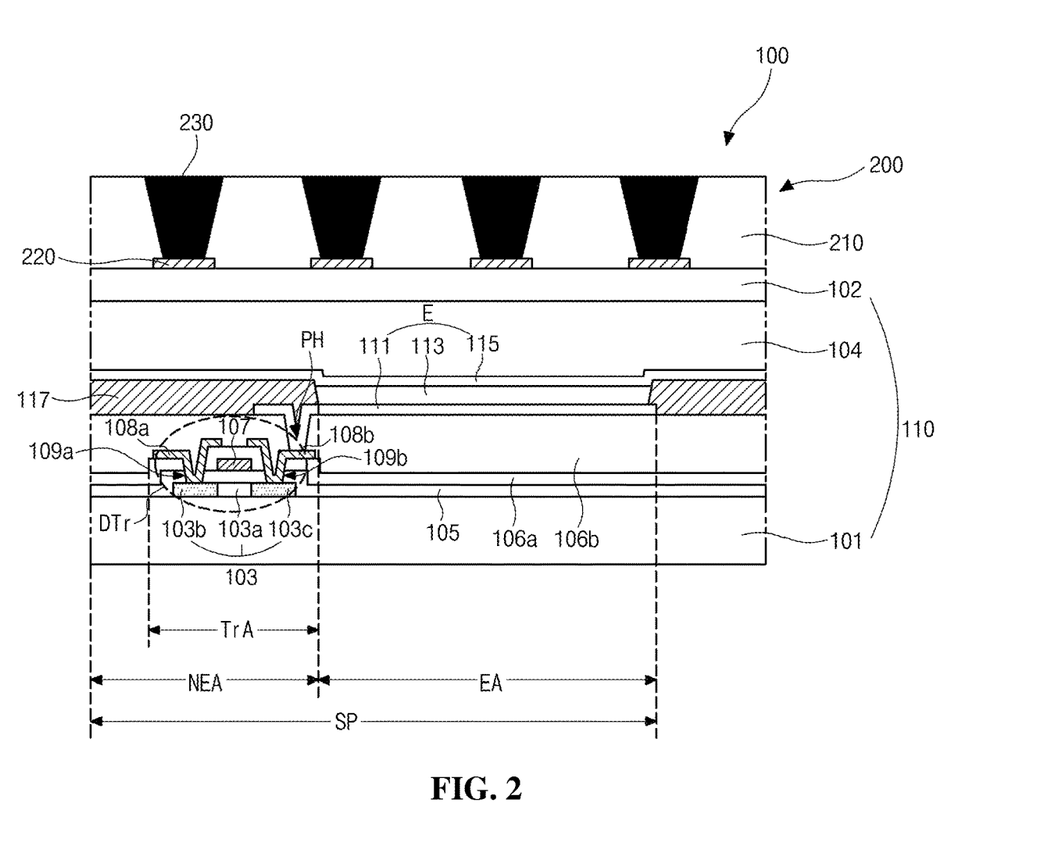
FIG. 2 is a cross-sectional view schematically illustrating a display device including a light control layer according to the aspect of the present disclosure.

FIG. 2 is a cross-sectional view schematically illustrating a display device including a light control layer according to the aspect of the present disclosure.

In FIG. 2, the display device 100 according to the aspect of the present disclosure includes a display panel 110 capable of implementing an image and a light control layer 200 located at a surface of the display device 110 through which light is transmitted.

Here, the display device 110 implementing an image may be one of a liquid crystal display (LCD) device, a plasma display panel (PDP) device, a field emission display (FED) device, an electroluminescent display (ELD) device, and an organic light-emitting diode display (OLED) device. The OLED device may be used, which is a representative of a flexible display device that can maintain the display performance even when it is bent like paper.

Since the OLED device is a self-luminous device and does not need a backlight used in a liquid crystal display device, it can be lightweight and thin.

The OLED device has a wide viewing angle and high contrast ratio as compared with a liquid crystal display device and has advantages in power consumption. In addition, the OLED device is driven by low voltages of direct current (DC) and has a fast response time. Further, the OLED device is strong against the external impacts and is used in a wide range of temperatures because its components are solids.

In particular, since the manufacturing process is simple, there is an advantage that can reduce the production cost more than the liquid crystal display device.

In the display panel 110 formed of the OLED device, a driving thin film transistor DTr and a light-emitting diode E are disposed in each sub-pixel SP on a substrate 101, and the substrate 101 is encapsulated by a protective film 102.

The display panel 110 formed of the OLED device according to the aspect of the present disclosure may be a top emission type and a bottom emission type according to a light transmission direction. In the present disclosure, a top emission type will be described as an example.

In addition, for convenience of explanation, one sub-pixel SP includes an emission area EA and a non-emission area NEA, an area where the light-emitting diode E is formed is defined as the emission area EA, and an area where the driving thin film transistor DTr is formed in the non-emission area NEA is defined as a switching area TrA.

In the display panel 110, a semiconductor layer 103 is disposed in the switching area TrA of the non-emission area NEA of the sub-pixel SP on the substrate 101. The semiconductor layer 103 is formed of polycrystalline silicon and includes an active region 103*a* constituting a channel and source and drain regions 103*b* and 103*c* doped with a high concentration of impurities on both sides of the active region 103*a*.

A gate insulating layer 105 is formed on the semiconductor layer 103, and a gate electrode 107 and a gate line (not shown) are formed on the gate insulating layer 105. The gate electrode 107 corresponds to the active region 103*a* of the semiconductor layer 103, and the gate line extends in one direction.

A first insulating layer 106*a*, which may be referred to as an interlayer insulating layer, is formed on the gate electrode 107 and the gate line. Here, the first insulating layer 106*a* and the gate insulating layer 105 thereunder have first and second semiconductor contact holes 109*a* and 109*b* exposing the source and drain regions 103*b* and 103*c*, respectively.

Next, source and drain electrodes 108a and 108b are formed on the first insulating layer 106a including the first and second semiconductor contact holes 109a and 109b. The source and drain electrodes 108a and 108b are spaced apart from each other and are in contact with the source and drain regions 103b and 103c exposed through the first and second semiconductor contact holes 109a and 109b, respectively.

A second insulating layer 106b is formed on the source and drain electrodes 108a and 108b and the first insulating layer 106a exposed between the source and drain electrodes 108a and 108b.

In this case, the source and drain electrodes 108a and 108b, the semiconductor layer 103 including the source and drain regions 103b and 103c contacting the source and drain electrodes 108a and 108b, the gate insulating layer 105 on the semiconductor layer 103, and the gate electrode 107 constitute the driving thin film transistor DTr.

Meanwhile, although not shown in the figure, a data line crosses the gate line to define each sub-pixel SP, and a switching thin film transistor, which has the same structure as the driving thin film transistor DTr, is connected to the driving thin film transistor DTr.

Here, the switching thin film transistor and the driving thin film transistor DTr may be polycrystalline silicon thin film transistor (p-Si TFT) in which the semiconductor layer 103 is formed of polycrystalline silicon. Alternatively, the switching thin film transistor and the driving thin film transistor DTr may be amorphous silicon thin film transistor (a-Si TFT), single crystalline silicon thin film transistor (c-Si TFT) or oxide thin film transistor (oxide TFT) according to a material of the semiconductor layer 103. In the figure, the driving thin film transistor DTr has a top gate structure in which the gate electrode 107 is disposed over the semiconductor layer 103. However, as a modified example, the driving thin film transistor may have a bottom gate structure in which the gate electrode is disposed under the semiconductor layer, and in this case, the semiconductor layer may include an active layer of intrinsic amorphous silicon and ohmic contact layers of impurity-doped amorphous silicon.

The first insulating layer 106a and the second insulating layer 106b have a drain contact hole PH exposing the drain electrode 108b.

A first electrode 111 is formed on the second insulating layer 106b. The first electrode 111 is connected to the drain electrode 108b of the driving thin film transistor DTr through the drain contact hole PH. The first electrode 111 is formed of a conductive material having relatively high work function. The first electrode 111 functions as an anode of the light-emitting diode E.

For example, the first electrode 111 may be formed of a metal oxide such as indium tin oxide (ITO) or indium zinc oxide (IZO), a mixture of metal and oxide such as ZnO:Al or SnO2:Sb, a conductive polymer such as poly(3-methylthiophene), poly[3,4-(ethylene-1,2-dioxy)thiophene] (PEDT), polypyrrole or polyaniline. Alternatively, the first electrode 111 may be formed of carbon nanotube (CNT), graphene, silver nanowire or the like.

The first electrode 111 is disposed in each sub-pixel SP, and a bank 117 is disposed between the first electrodes 111 of adjacent sub-pixels SP. That is, the first electrode 111 is separated for each sub-pixel SP by using the bank 117 as a boundary for each sub-pixel SP.

A light-emitting layer 113 is formed on the first electrode 111. The light-emitting layer 113 may be a single layer of a luminescent material. The luminescent material may be organic. Alternatively, the light-emitting layer 113 may include multiple layers of a hole injection layer, a hole transporting layer, an emitting material layer, an electron transporting layer, and an electron injection layer.

A second electrode 115 is formed on the light-emitting layer 113 substantially all over the substrate 101. The second electrode 115 functions as a cathode of the light-emitting diode E.

The second electrode 115 may be formed of a material having a relatively low work function value. At this time, the second electrode 115 may be a single layer of an alloy composed of a first metal such as silver (Ag) or the like having relatively low work function and a second metal such as magnesium (Mg) or the like at a predetermined ratio. Alternatively, the second electrode 115 may be a double layer or a multiple layer.

In the OLED display device 100, when a predetermined voltage is applied to the first electrode 111 and the second electrode 115 according to a selected signal, a hole injected from the first electrode 111 and an electron provided from the second electrode 115 are transported to the organic light-emitting layer 113 to form an exciton. Then, when the exciton transitions from the excited state to the ground state, light is generated and emitted in the form of visible light.

The light emitted from the light-emitting diode E is outputted to the outside through the transparent second electrode 115, and the display panel 110 displays an arbitrary image.

Here, a wavelength conversion layer (not shown) may be disposed to correspond to each emission area EA of each sub-pixel SP. The wavelength conversion layer may include a color filter that transmits only the wavelength of the specific color for each sub-pixel SP of white light emitted from the light-emitting diode E toward the substrate 101.

The wavelength conversion layer may transmit only red, green or blue wavelength. At this time, the wavelength conversion layer provided in the red sub-pixel R-SP of FIG. 1 may include a red color filter, the wavelength conversion layer provided in the green sub-pixel G-SP of FIG. 1 may include a green color filter, and the wavelength conversion layer provided in the blue sub-pixel B-SP of FIG. 1 may include a blue color filter.

Alternatively, the wavelength conversion layer may be omitted, and red, green and blue light may be directly emitted for respective sub-pixels SP.

Therefore, the display panel 110 according to the aspect of the present disclosure emits R, G and B colors for respective sub-pixels SP, thereby realizing full color of high brightness.

Then, a protective film 102 having a thin film shape is positioned over the driving thin film transistor DTr and the light-emitting diode E, and a face seal 104, which is formed of an organic or inorganic material having transparent and adhesive properties, is interposed between the protective film 102 and the substrate 101, thereby attaching the protective film 102 and the substrate 101 and encapsulating the OLED display device 100.

Here, the display device 100 according to the aspect of the present disclosure is characterized in that the light control layer 200 is further disposed outside the protective film 102 of the display panel 110 through which light is transmitted.

The light control layer 200 includes a plurality of light absorption patterns 230 spaced apart from each other by a predetermined distance, thereby limiting the viewing angle of the display device 100. That is, each of the plurality of light absorption patterns 230 selectively blocks a propagation path of incident light, for example, light incident from the display panel 110, thereby controlling the wide viewing angle of the display panel 110 at a narrow viewing angle.

The light control layer 200 further includes a transparent resin layer 210, the plurality of light absorption patterns 230 are spaced apart from each other in the transparent resin layer 210. The resin layer 210 between the adjacent light absorption patterns 230 becomes a light transmission portion. The light absorption patterns 230 and the light transmission portions are alternately disposed.

The transparent resin layer 210 may be formed of a photo isotropic material having relatively high transmittance. The resin layer 210 may be formed of polyimide (PI), cyclic olefin polymer (COP), polycarbonate (PC), polyethylene terephthalate (PET), polyethylene naphthalate (PEN), polynorbornene (PNB), polyethersulfone (PES), or the like.

The light absorption patterns 230 positioned in the resin layer 210 may be formed of a black resin or a dye that absorbs light. When the light absorption patterns 230 are formed of a dye, the light absorption patterns 230 may include at least four to five dyes that absorb light of different colors.

Here, each of the light absorption patterns 230 may have a width d1 and d2 (see FIG. 4) that increases in a propagation direction of light, which will be described in detail later.

Reflection patterns 220 are disposed under the light absorption patterns 230, respectively. Each of the reflection patterns 220 may be formed of a light reflective material including a metal such as aluminum (Al) or silver (Ag). The reflection patterns 220 blocks light incident at a predetermined angle or more from the display panel 110, that is, reflects the light toward the display panel 110, thereby minimizing the loss of the light traveling to the light absorption patterns 230. At the same time, the light efficiency of the display panel 110 is improved by recycling the reflected light.

Namely, in the display device 100 according to the aspect of the present disclosure, the wide viewing angle of the display device 100 can be narrowed by further disposing the light control layer 200 including the light absorption patterns 230 and the reflection patterns 220 on the outside of the protective film 102 of the display panel 110 through which light is transmitted.

Through this, the display device 100 according to the aspect of the present disclosure can protect the privacy, and it is not needed to add a separate film for limiting the viewing angle, thereby realizing the light weight and thinness of the display device 100.

Particularly, the viewing angle can be limited at low cost, and the structure can also be simplified to thereby improve the efficiency of the process.

In addition, the light efficiency of the display panel 110 can be improved by recycling the light, which travels at a predetermined angle or more toward the light absorption patterns 230, using the reflection patterns 220.

Figure 3A:
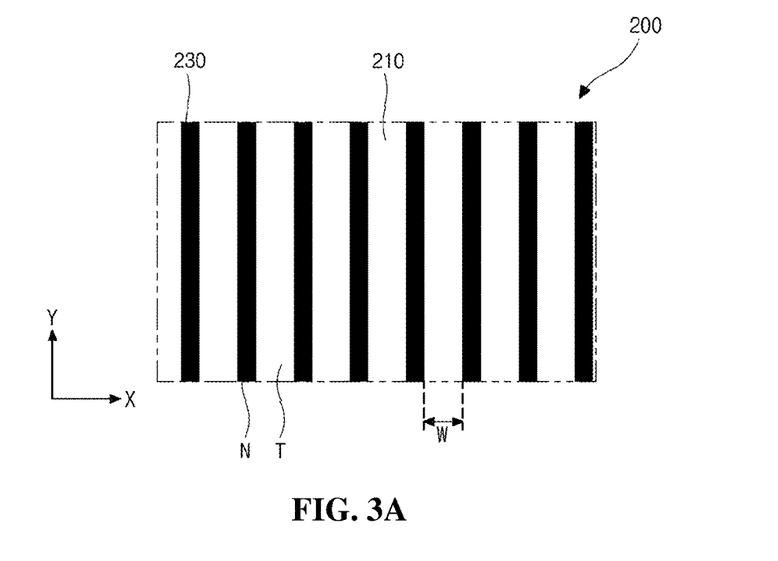
FIGS. 3A to 3C are plan views schematically illustrating shapes of light absorption patterns variously formed in a light control layer.
Figure 3B:
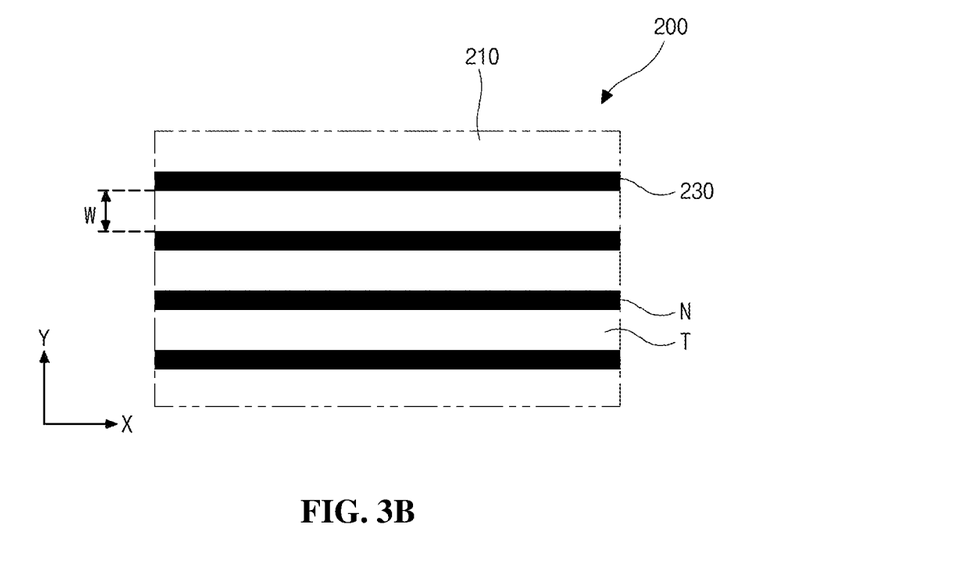
Figure 3C:
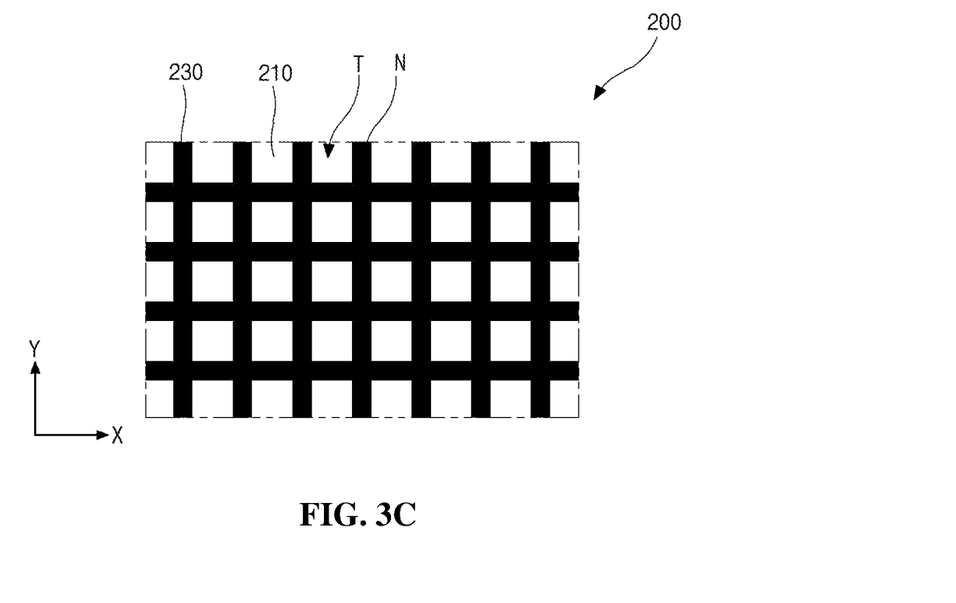

FIGS. 3A to 3C are plan views schematically illustrating shapes of light absorption patterns variously formed in a light control layer.

As shown in FIG. 3A, in the light control layer 200, the light absorption patterns 230 may be formed in a resin layer 210 such that the light absorption patterns 230 have a shape of stripes parallel to a first length direction Y of the resin layer 210 and spaced apart from each other with a predetermined distance W in a second length direction X crossing the first length direction Y of the resin layer 210.

In this case, the display device 100 of FIG. 2 according to the aspect of the present disclosure can control left and right viewing angle (or horizontal viewing angle) of the display panel 110 corresponding to the second length direction X of the light control layer 200.

In addition, as shown in FIG. 3B, the light absorption patterns 230 may be formed in the resin layer 210 such that the light absorption patterns 230 have a shape of stripes parallel to the second length direction X of the resin layer 210 and spaced apart from each other with a predetermined distance W in the first length direction Y of the resin layer 210. In this case, the display device 100 of FIG. 2 according to the aspect of the present disclosure can control up and down viewing angle (or vertical viewing angle) of the display panel 110 corresponding to the first length direction Y of the light control layer 200.

In addition, as shown in FIG. 3C, the light absorption patterns 230 may be provided in a mesh shape along the first and second length directions Y and X. In this case, the display device 100 of FIG. 2 according to the present disclosure can control the up and down viewing angle and the left and right viewing angle of the display panel 110 of FIG. 2.

The light absorption patterns 230 may be formed by a printing process or a patterning process. For example, the printing process may include roll printing, screen printing gravure printing, gravure-offset printing, or flexo printing. The light absorption patterns 230 may be formed by an etching process of selectively etching the resin layer 210 after placing a mask on the resin layer 210. The etching process may be a wet etching process, a dry etching process or a laser scribing process.

As described above, in the display device 100 of FIG. 2 according to the aspect of the present disclosure, the light control layer 200 includes the plurality of light absorption patterns 230, so that the light control layer 200 has light blocking regions N corresponding to the light absorption patterns 230 and light transmission regions T between the light absorption patterns 230.

Accordingly, incident light at a predetermined angle or more from the display panel 110 of FIG. 2 is blocked by the plurality of light absorption patterns 230, and incident light at an angle less than the predetermined angle from the display panel 110 of FIG. 2 is transmitted through the light transmission regions T between the light absorption patterns 230, so that the up and down and/or left and right viewing angle of the display panel 110 of FIG. 2 can be controlled at a narrow viewing angle.

Further, by further disposing the light reflection patterns 220 of FIG. 2 under the light absorption patterns 230, respectively, the light traveling at the predetermined angle or more is recycled by the reflection patterns 220 of FIG. 2, and the light efficiency of the display panel 110 of FIG. 2 may also be improved.

That is, the incident light at the predetermined angle or more from the display panel 110 of FIG. 2 may be absorbed and removed by each absorption pattern 230. However, in the display device 100 of FIG. 2 according to the aspect of the present disclosure, some of the incident light at the predetermined angle or more from the display panel 110 of FIG. 2 may be reflected and recycled, and the amount of light absorbed by the light absorption patterns 230 may be significantly reduced.

Therefore, the light efficiency of the display panel 110 of FIG. 2 may be improved.

Figure 4:
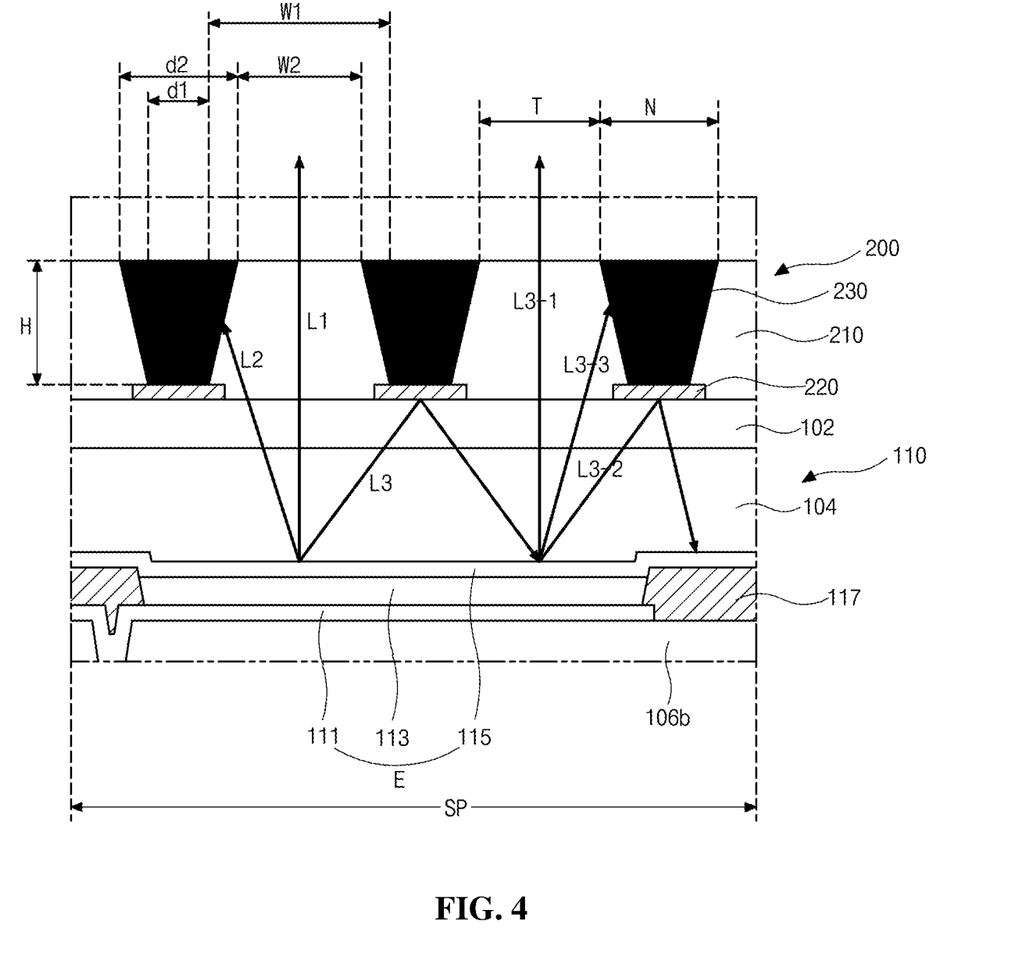
FIG. 4 is a partially enlarged view of FIG. 2 and schematically illustrates paths of light through a light control layer 200 to implement a narrow viewing angle.

FIG. 4 is a partially enlarged view of FIG. 2 and schematically illustrates paths of light through a light control layer 200 to implement a narrow viewing angle.

In FIG. 4, light emitted from the light-emitting layer 113 of the sub-pixel is transmitted to the outside through the second electrode 115. At this time, among the light emitted from the light-emitting layer 113, light L1 vertically emitted toward a front surface of the display panel 110 is transmitted through the light transmission region T formed of only the resin layer 210 of the light control layer 200 as it is and is emitted to the outside.

On the other hand, among the light emitted from the light-emitting layer 113, some light L2 incident on the light control layer 200 at the predetermined angle or more is absorbed and dissipated by the light absorption patterns 230.

In addition, among the light emitted from the light-emitting layer 113, other light L3 incident on the light control layer 200 at the predetermined angle or more is reflected by the reflection patterns 220 and is incident on the inside of the display panel 110.

The light L3 incident on the inside of the display panel 110 is reflected again in the display panel 110, so that some light L3-1 may be transmitted through the light transmission region T of the light control layer 200 and is outputted to the outside, other light L3-2 may be reflected again by the reflection patterns 220, or other light L3-3 may be absorbed and removed by the light absorption patterns 230.

Through this, the display device 100 of FIG. 2 according to the aspect of the present disclosure can narrow the viewing angle and can protect the privacy, and since it is not necessary to add the separate film, the light weight and thinness of the display device 100 of FIG. 2 can be implemented.

In particular, the viewing angle can be limited at low cost, and the structure can also be simplified to thereby improve the efficiency of the process.

In addition, the light efficiency of the display panel 110 can be improved by recycling some light L3, which travels at the predetermined angle or more toward the light absorption patterns 230, using the reflection patterns 220.

Here, each of the light absorption patterns 230 may have a width that increases as the light travels toward the light traveling direction. That is, when one side of the light control layer 200 facing the display panel 110 is defined as a lower surface and the opposite side is defined as an upper surface, the width of the light absorption patterns 230 increases from the lower surface to the upper surface. Here, the width d1 of the light absorption patterns 230 at the lower surface is smaller than the width d2 of the light absorption patterns 230 at the upper surface.

However, the present disclosure is not limited thereto. Alternatively, the light absorption patterns 230 may have the same width at the upper and lower surfaces of the light control layer 200.

Meanwhile, when the width of the light absorption patterns 230 increases from the upper surface of the light control layer 200 to the lower surface, the viewing angle θ of the display panel 110 is narrower, and thus, there occurs a limit in controlling the viewing angle θ of the display panel 110.

In the light absorption patterns 230 having different widths d1 and d2 at the upper surface and the lower surface of the light control layer 200, a distance W between adjacent light absorption patterns 230 may be defined as and divided into a first distance W1 at the lower surface of the light control layer 200 and a second distance W2 at the upper surface of the light control layer 200.

A value that is obtained by adding the first and second distances W1 and W2 and then dividing it by half corresponds to an average width D. This is shown by equation 1.

$$\frac{d1 + d2}{2} = D \qquad \text{<Equation 1>}$$

Here, when a height of the light absorption patterns 230 is defined as H, the light absorption patterns 230 may control an angle of the light incident on the light control layer 200, that is, a viewing angle θ, according to values of H and D as shown in equation 2 below $$\tan^{-1}\left(\frac{D}{H}\right) = \theta \qquad \text{<Equation 2>}$$

When H and D are the same, the viewing angle θ of the display panel 110 is 45°.

As described above, the viewing angle θ may be further narrowed or widened by adjusting the height H of the light absorption patterns 230 and the distance W between the light absorption patterns 230 or the width D of the light absorption patterns 230.

That is, each of the light absorption patterns 230 may have a predetermined height H according to the viewing angle θ of the display panel 110. For example, each of the light absorption patterns 230 may have the height H of 10 μm or more, but is not limited thereto. Alternatively, each of the light absorption patterns 230 may have the height H that can block light traveling from the display panel 110 at an angle of ±30 degrees up and down and/or left and right with respect to a surface vertical to the display device 110.

Here, the viewing angle θ of the display panel 110 becomes narrower as the height H of the light absorption patterns 230 increases, so that the height H of the light absorption patterns 230 may be determined as a thickness of 10 μm or more according to the narrow viewing angle θ set in the display panel 110.

In addition, the width D (d1, d2) of the light absorption patterns 230, beneficially, may be set to 10% or more and 50% or less of the distance W (W1, W2) between adjacent light absorption patterns 230. When the width D (d1, d2) of the light absorption patterns 230 is less than 10% of the distance W (W1, W2) between adjacent light absorption patterns 230, the amount of light passing through the light transmission region T between the light absorption patterns 230 is relatively large, and there is a limit in narrowing the viewing angle θ of the display panel 110.

When the width D (d1, d2) of the light absorption patterns 230 is more than 50% of the distance W (W1, W2) between adjacent light absorption patterns 230, the amount of light passing through the light transmission region T between the light absorption patterns 230 is relatively small, thereby lowering the brightness of the display panel 110 itself.

As described above, by disposing the light control layer 200 including the light absorption patterns 230 on one side of the display panel 110 where the light is transmitted, that is, the outside of the protective film 102, the display device 100 according to the aspect of the present disclosure can narrow the wide viewing angle and thus can protect the privacy. Since it is not necessary to add the separate film for limiting the viewing angle, the light weight and thinness of the display device 100 can be implemented.

In particular, the viewing angle can be limited at low cost, and the structure can also be simplified to thereby improve the efficiency of the process.

In addition, the light efficiency of the display panel 110 can be improved by recycling some light L3 of FIG. 4, which travels at the predetermined angle or more toward the light absorption patterns 230, using the reflection patterns 220.

Figure 5:
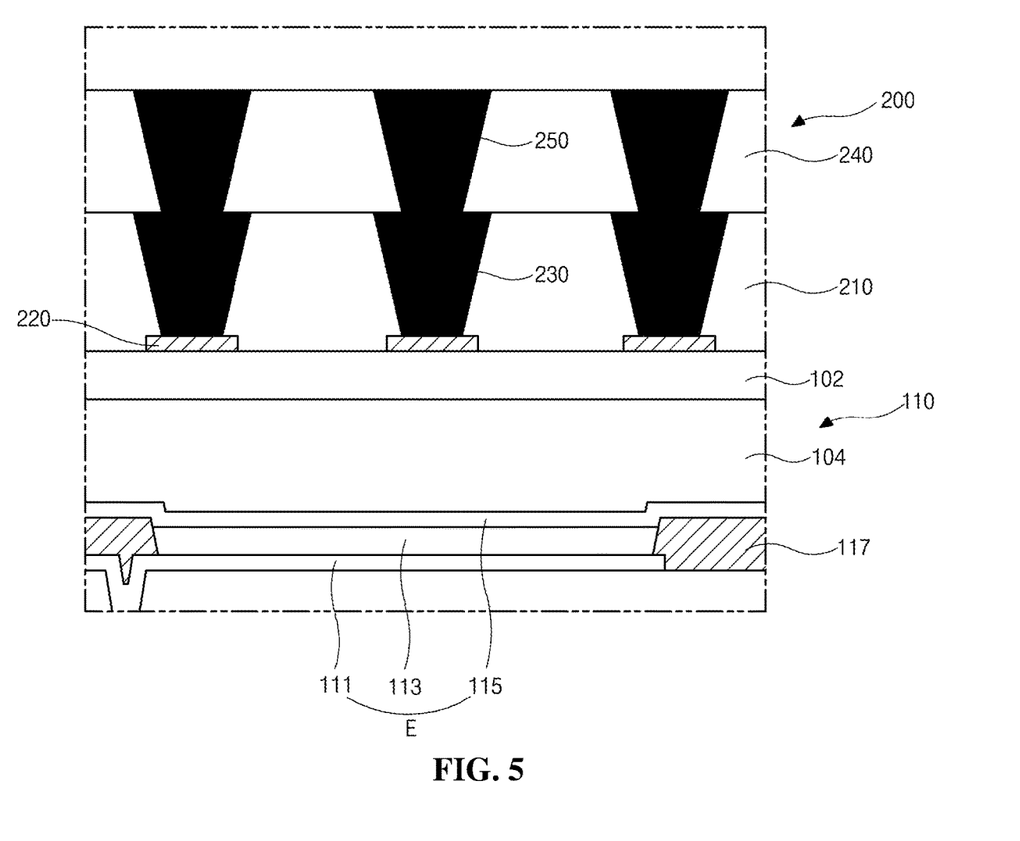
FIG. 5 is a cross-sectional view schematically illustrating a display device according to another aspect of the present disclosure.

Meanwhile, although the light control layer 200 is described and illustrated as a single layer above, the light control layer 200 may be formed to have a double layer according to the viewing angle θ of the display panel 110 to be implemented as shown in FIG. 5.

That is, a second resin layer 240 including second light absorption patterns 250 may be further disposed on a first resin layer 210 including reflection patterns 220 and first light absorption patterns 230.

When the light control layer 200 is formed to be divided into two layers, the efficiency of the process of forming the light control layer 200 of the display device 100 according to the viewing angle θ to be implemented may be improved.

Particularly, to further improve the convenience of the process, the first light absorption patterns 230 and the second light absorption patterns 250 are formed to have the same width d1 and d2 of FIG. 4, so that the second light absorption patterns 250 may be formed by the same process of forming the first light absorption patterns 230.

In addition, although not shown in the figures, the reflection patterns 220 disposed under the first light absorption patterns 230 may be provided as a separate component and may serve to improve the light efficiency of the display panel 110 while functioning as a touch electrode.

As described above, by disposing the light control layer including the light absorption patterns on one side of the display panel where the light is transmitted, the display device according to the aspect of the present disclosure can narrow the wide viewing angle and thus can protect the privacy. Since it is not necessary to add the separate film for limiting the viewing angle, the light weight and thinness of the display device can be implemented.

In particular, the viewing angle can be limited at low cost, and the structure can also be simplified to thereby improve the efficiency of the process.

In addition, the light efficiency of the display panel can be improved by recycling some light, which travels at the predetermined angle or more toward the light absorption patterns, using the reflection patterns.

It will be apparent to those skilled in the art that various modifications and variations can be made in the rollable display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display panel;
   a light control layer disposed on one side of the display panel through which light is transmitted, wherein the light control layer includes a plurality of light absorption patterns spaced apart from each other; and
   a plurality of reflection patterns disposed under the plurality of light absorption patterns and reflecting light travelling toward to the plurality of light absorption patterns,
   wherein a thickness of the plurality of light absorption patterns is greater than a thickness of the plurality of reflection patterns.

2. The display device of claim 1, wherein the light control layer is formed of a transparent resin, and the plurality of light absorption patterns is disposed in the light control layer, and
   wherein the light control layer has a light blocking region where the plurality of light absorption patterns is disposed and a light transmission region where the plurality of light absorption patterns is not disposed.

3. The display device of claim 2, wherein the transparent resin includes one of polyimide (PI), cyclic olefin polymer (COP), polycarbonate (PC), polyethylene terephthalate (PET), polyethylene naphthalate (PEN), polynorbornene (PNB) and polyethersulfone (PES).

4. The display device of claim 2, wherein the plurality of light absorption patterns includes a black resin or a dye that absorbs light.

5. The display device of claim 1, wherein the plurality of light absorption patterns has a width in cross-section that increases as the plurality of light absorption patterns is distanced away from the display panel.

6. The display device of claim 1, wherein the plurality of light absorption patterns has a height that blocks light which travels at ±30 degrees up and down and left and right from the display panel.

7. The display device of claim 1, wherein the plurality of light absorption patterns has a width that is 10~50% of a distance between adjacent two light absorption patterns.

8. The display device of claim 1, wherein the plurality of light absorption patterns has a shape of stripes parallel to a first length direction of the light control layer or a second length direction perpendicular to the first length direction.

9. The display device of claim 1, wherein the plurality of light absorption patterns has a mesh shape formed along a first length direction of the light control layer and a second length perpendicular to the first length direction.

10. The display device of claim 1, wherein the plurality of reflection patterns includes a light reflective material.

11. The display device of claim 1, wherein the display panel includes a driving thin film transistor and a light-emitting diode for each sub-pixel,
    wherein the thin film transistor includes a semiconductor layer, a gate insulating layer on the semiconductor layer, a gate electrode on the gate insulating layer, an interlayer insulating layer on the gate electrode, and source and drain electrodes on the interlayer insulating layer, and
    wherein the light-emitting diode includes a first electrode connected to the driving thin film transistor, a light-emitting layer on the first electrode, and a second electrode on the light-emitting layer.

12. The display device of claim 11, wherein the light-emitting diode and the driving thin film transistor are encapsulated by a protective film, and
    wherein the light control layer is disposed on an outside surface of the protective film.

13. The display device of claim 1, wherein the display panel includes a plurality of sub-pixel each having an emission area and a non-emission area, and at least one of the plurality of light absorption patterns overlaps the emission area.

14. A display device, comprising:
    a display panel;
    a plurality of reflection patterns disposed on the display panel and blocking light incident at a predetermined angle from the display panel and reflecting the light toward the display panel;
    a first light control layer disposed on the display panel; and
    a plurality of first light absorption patterns spaced apart from each other and disposed in the first light control layer and selectively blocking a propagation path of incident light from the display panel, wherein the plurality of first light absorption patterns has a width that increases from a lower surface of the light control layer to an upper surface of the light control layer, and wherein a thickness of the plurality of first light absorption patterns is greater than a thickness of the plurality of reflection patterns.

15. The display device of claim 14, further comprising:
a second light control layer disposed on the first light control layer; and
a plurality of second light absorption patterns spaced apart from each other and disposed in the second light control layer and selectively blocking a propagation path of incident light from the first light control layer.

16. The display device of claim 14, wherein the plurality of first light absorption patterns has a width that is 10~50% of a distance between adjacent two first light absorption patterns.

17. The display device of claim 14, wherein the plurality of light absorption patterns has a shape of stripes parallel to a first length direction of the first light control layer or a second length direction perpendicular to the first length direction.

18. The display device of claim 14, wherein the plurality of first light absorption patterns has a mesh shape formed along a first length direction of the first light control layer and a second length perpendicular to the first length direction.

19. The display device of claim 14, wherein the plurality of reflection patterns includes a light reflective material.

20. The display device of claim 14, wherein the display panel includes a driving thin film transistor and a light-emitting diode for each sub-pixel,
wherein the thin film transistor includes a semiconductor layer, a gate insulating layer on the semiconductor layer, a gate electrode on the gate insulating layer, an interlayer insulating layer on the gate electrode, and source and drain electrodes on the interlayer insulating layer, and
wherein the light-emitting diode includes a first electrode connected to the driving thin film transistor, a light-emitting layer on the first electrode, and a second electrode on the light-emitting layer.

21. The display device of claim 20, wherein the light-emitting diode and the driving thin film transistor are encapsulated by a protective film.

* * * * *